United States Patent
Wu et al.

(10) Patent No.: US 12,310,248 B2
(45) Date of Patent: May 20, 2025

(54) DIFFUSION BARRIER LAYER ON INTERCONNECTION VIAS FOR MAGNETIC TUNNEL JUNCTIONS

(71) Applicant: Taiwan Semiconductor Manufacturing Co., Ltd., Hsinchu (TW)

(72) Inventors: Jung-Tang Wu, Kaohsiung (TW); Jui-Hung Ho, Hsinchu (TW); Chin-Szu Lee, Taoyuan (TW); Meng-Yu Wu, Taichung (TW); Szu-Hua Wu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/148,829

(22) Filed: Dec. 30, 2022

(65) Prior Publication Data

US 2023/0137291 A1    May 4, 2023

Related U.S. Application Data

(60) Continuation of application No. 17/334,536, filed on May 28, 2021, now Pat. No. 11,696,510, which is a
(Continued)

(51) Int. Cl.
*H10N 50/01*  (2023.01)
*H01L 21/768*  (2006.01)
(Continued)

(52) U.S. Cl.
CPC ....... *H10N 50/01* (2023.02); *H01L 21/76802* (2013.01); *H01L 21/76841* (2013.01);
(Continued)

(58) Field of Classification Search
CPC ......... H01L 21/28562; H01L 21/76802; H01L 21/76841; H01L 21/76849; H01L 21/768;
(Continued)

(56) References Cited

U.S. PATENT DOCUMENTS

| | | | |
|---|---|---|---|
| 8,405,172 | B2 | 3/2013 | Tsujiuchi et al. |
| 9,209,074 | B2 | 12/2015 | Lu et al. |

(Continued)

FOREIGN PATENT DOCUMENTS

| | | |
|---|---|---|
| CN | 102208429 A | 10/2011 |
| CN | 102915978 A | 2/2013 |

(Continued)

OTHER PUBLICATIONS

Office Action, dated Aug. 30, 2020, for Korean Intellectual Property Office Appl. No. 10-2019-0077364, 7 pages.

*Primary Examiner* — Cheung Lee
(74) *Attorney, Agent, or Firm* — Sterne, Kessler, Goldstein & Fox P.L.L.C.

(57) ABSTRACT

The present disclosure describes an exemplary method that can prevent or reduce out-diffusion of Cu from interconnect layers to magnetic tunnel junction (MTJ) structures. The method includes forming an interconnect layer over a substrate that includes an interlayer dielectric stack with openings therein; disposing a metal in the openings to form corresponding conductive structures; and selectively depositing a diffusion barrier layer on the metal. In the method, selectively depositing the diffusion barrier layer includes pre-treating the surface of the metal; disposing a precursor to selectively form a partially-decomposed precursor layer on the metal; and exposing the partially-decomposed precursor layer to a plasma to form the diffusion barrier layer. The method further includes forming an MTJ structure on the interconnect layer over the diffusion barrier layer, where
(Continued)

the bottom electrode of the MTJ structure is aligned to the diffusion barrier layer.

20 Claims, 10 Drawing Sheets

Related U.S. Application Data division of application No. 16/210,226, filed on Dec. 5, 2018, now Pat. No. 11,024,801.

(60) Provisional application No. 62/690,638, filed on Jun. 27, 2018.

(51) Int. Cl.
  *H01L 23/532* (2006.01)
  *H10N 50/80* (2023.01)
  *H10N 70/00* (2023.01)

(52) U.S. Cl.
  CPC .... *H01L 21/76849* (2013.01); *H01L 21/7685* (2013.01); *H01L 23/53238* (2013.01); *H10N 50/80* (2023.02); *H10N 70/826* (2023.02)

(58) Field of Classification Search
  CPC ........... H01L 21/76883; H01L 23/5226; H01L 23/53238; H01L 23/53266; H10B 61/00; H10N 50/01; H10N 50/10; H10N 50/80; H10N 59/00; H10N 70/011; H10N 70/826; G11C 11/161
  See application file for complete search history.

(56) References Cited

U.S. PATENT DOCUMENTS

| | | | |
|---|---|---|---|
| 9,269,612 | B2 | 2/2016 | Chen et al. |
| 9,502,466 | B1 | 11/2016 | Chuang et al. |
| 9,711,713 | B1 | 7/2017 | Chou et al. |
| 9,893,278 | B1 | 2/2018 | Chuang et al. |
| 10,032,828 | B2 | 7/2018 | Chuang et al. |
| 10,164,169 | B2 | 12/2018 | Chuang et al. |
| 10,468,587 | B2 | 11/2019 | Chou et al. |
| 2004/0201919 | A1 | 10/2004 | Tuttle |
| 2005/0052938 | A1 | 3/2005 | Horikoshi |
| 2010/0109106 | A1 | 5/2010 | Zhong et al. |
| 2010/0248473 | A1 | 10/2010 | Ishizaka et al. |
| 2012/0043630 | A1 | 2/2012 | Omori et al. |
| 2013/0127055 | A1 | 5/2013 | Chen et al. |
| 2015/0069620 | A1* | 3/2015 | Chi ................... H01L 21/76868 438/653 |
| 2015/0380296 | A1 | 12/2015 | Antonelli et al. |
| 2016/0017487 | A1 | 1/2016 | Chen et al. |
| 2016/0049584 | A1 | 2/2016 | Dang et al. |
| 2016/0079173 | A1* | 3/2016 | Tung ................. H01L 21/76834 438/653 |
| 2018/0040817 | A1* | 2/2018 | Chuang ................. H10N 70/20 |
| 2020/0006639 | A1 | 1/2020 | Wu et al. |

FOREIGN PATENT DOCUMENTS

| | | |
|---|---|---|
| CN | 107039581 A | 8/2017 |
| KR | 20110059741 A | 6/2011 |
| KR | 20130056815 A | 5/2013 |
| TW | 201612351 A | 4/2016 |
| TW | 201806114 A | 2/2018 |
| TW | 201813072 A | 4/2018 |
| TW | 201814775 A | 4/2018 |

* cited by examiner

DIFFUSION BARRIER LAYER ON INTERCONNECTION VIAS FOR MAGNETIC TUNNEL JUNCTIONS

CROSS-REFERENCE TO RELATED APPLICATION

This application is a continuation of U.S. patent application Ser. No. 17/334,536, titled "Diffusion Layer for Magnetic Tunnel Junctions," filed May 28, 2021, which is a divisional of U.S. patent application Ser. No. 16/210,226, titled "Diffusion Layer for Magnetic Tunnel Junctions," filed Dec. 5, 2018, which claims the benefit of U.S. Provisional Patent Application No. 62/690,638, titled "Diffusion Layer for Magnetic Tunnel Junctions," filed Jun. 27, 2018, each of which is incorporated by reference in its entirety.

BACKGROUND

In integrated circuits (ICs), magnetic tunneling junctions (MTJs) are an integral part of magnetic random access memories (MRAMs). The MTJ structures can be formed in the back end of the line (BEOL) between layers of interconnects (e.g., lines and vias) that include a metal (e.g., copper) or metal alloy (e.g., copper alloy). Diffusion of the metal or metal alloy from the interconnect layers to the MTJ structures can disrupt the MRAMs' operation.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
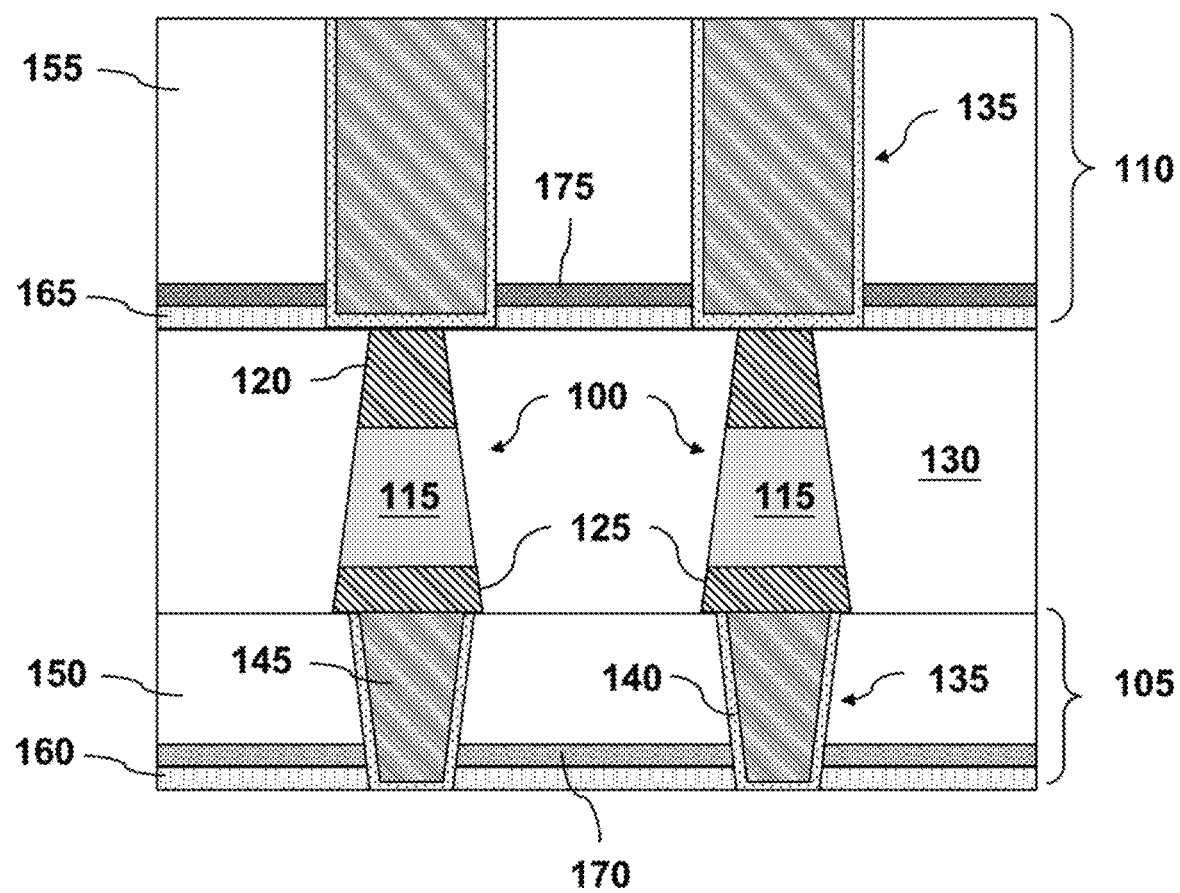
FIG. 1 is a cross-sectional view of a magnetic tunnel junction structure that is formed between two interconnect layers, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances. Unless defined otherwise, technical and scientific terms used herein have the same meanings as commonly understood by one of ordinary skill in the art to which this disclosure belongs.

In integrated circuits (ICs), magnetic tunneling junctions (MTJs) are an integral part of magnetic random access memories (MRAMs). The MTJ structures can be formed in the back end of the line (BEOL) between layers of interconnects filled with metal (e.g., copper (Cu)) or a metal alloy (e.g., copper alloy (Cu-alloy)). Out-diffusion of the metal or the metal alloy from neighboring interconnect layers into the MTJ structures can disrupt the MRAMs' operation and is therefore undesirable.

The embodiments described herein are directed to exemplary interconnect fabrication methods that can prevent metal (e.g., Cu) out-diffusion towards neighboring MTJ structures. For example, in some embodiments, a method is described for the formation of a cobalt (Co) or ruthenium (Ru) diffusion barrier layer between the Cu interconnects and the MTJ structures. The diffusion barrier layer can be selectively formed over Cu interconnects connected to bottom electrodes of the MTJ structures. As a result, the diffusion barrier layer can prevent out-diffusion of Cu from the interconnect layers. In another embodiment, a method is described that forms a Cu-free interconnect layer using a tungsten (W) metallization. W, unlike Cu, is not mobile and therefore does not out-diffuse to neighboring MTJ structures.

As discussed above, MTJ structures can be formed between BEOL interconnect layers. For example, one or more MTJ structures can be formed in an interlayer dielectric (ILD) between two interconnect layers. A cross-sectional view of exemplary MTJ structures 100 between two interconnect layers 105 and 110 is shown in FIG. 1. MTJ structure 100 is a multilayer structure that includes MTJ stack 115, a top electrode 120, and a bottom electrode 125. MTJ stack 115 can further include a non-conductive layer (not shown) disposed between two ferromagnetic layers (not shown). In some embodiments, the non-conductive layer can include magnesium oxide (MgO), aluminum oxide ($AlO_x$), aluminum oxynitride (AlON), or combinations thereof. According to some embodiments, the non-conductive layer can be deposited by a physical vapor deposition (PVD) technique. Alternatively, the non-conductive layer can be deposited by other deposition techniques, such as chemical vapor deposition (CVD), plasma-enhanced CVD (PECVD), atomic layer deposition (ALD), plasma-enhanced ALD (PEALD), or any other suitable deposition technique.

In some embodiments, the ferromagnetic layers can be metal stacks with one or more layers that include any combination of iron (Fe), cobalt (Co), ruthenium (Ru), and magnesium (Mg). Further, the ferromagnetic layers can be deposited by PVD, PEVD, CVD, PECVD, ALD, PEALD, or any other suitable deposition method. In some embodiments, the thickness of MTJ stack 115 can range from about 100 Å to about 400 Å.

Each of top and bottom electrodes 120 and 125 respectively are in electrical and physical contact with the ferromagnetic layers of MTJ stack 115. According to some embodiments, top electrode 120 can include tantalum (Ta), tantalum nitride (TaN), titanium nitride (TiN), or combinations thereof. For example, top electrode 120 can be a stack that includes a bottom TiN layer and a top TaN layer, which can be deposited by CVD or PVD. Bottom electrode 125 can include TiN, TaN, Ru, or combinations thereof and can be deposited by CVD or PVD. In some embodiments, top and bottom electrodes 120 and 125 can each have a thickness between about 300 Å and about 800 Å.

MTJ structure 100 can also include additional layers which are not shown in FIG. 1 for simplicity. Such layers can be for example one or more capping layers, or spacers, that electrically isolate MTJ structure 100. By way of example and not limitation, the capping layers, which are not shown in FIG. 1, can include a stack of materials, such as silicon nitride (SiN), silicon oxide ($SiO_2$), silicon carbon nitride (SiCN), or combinations thereof. In some embodiments, the capping layers can be deposited by CVD or ALD at a deposition temperature between about 140° C. and about 250° C. Further, the thickness of the capping layers can range from about 50 Å to about 3000 Å, according to some embodiments.

As shown in FIG. 1, MTJ structure 100 is embedded in ILD 130. In some embodiments, ILD 130 can be a low-k dielectric material with a dielectric constant (e.g., k-value) below 3.9 (e.g., 3.6), silicon nitride, silicon oxide, silicon oxynitride, fluorine-doped silicate glass (FSG), or an undoped oxide (UDOX). In some embodiments, ILD 130 can be a stack of dielectrics such as a low-k dielectric and another dielectric. The stack of dielectrics can be, for example, (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. Further, ILD 130 can be deposited by an atmospheric CVD (APCVD) process, a high-density plasma CVD (HDPCVD) process, or a PECVD process.

A shown in FIG. 1, top electrode 120 can be connected to top interconnect layer 110. Bottom electrode 125 can be connected to a bottom interconnect layer 105. By way of example and not limitation, bottom and top interconnect layers 105 and 110 can be formed by BEOL fabrication processes based on a Cu metallization scheme. In some embodiments, MTJ structures 100, which are embedded in ILD 130, may also be part of an interconnect layer. For example, ILD 130 may include conductive structures (e.g., vias) that electrically connect interconnect layers 105 and 110. These conductive structures are not shown in FIG. 1 for simplicity. Further, each of bottom and top interconnect layers 105 and 110 can include a network of interconnects such as vertical interconnect access lines (vias) 135 and lateral lines (lines) (not shown in FIG. 1) embedded in an ILD layer 150 and 155 respectively. Vias 135 provide electrical connections between layers and lines provide electrical connections within a layer. Vias 135 and lines can be filled with a metal stack that includes at least a barrier layer 140 and a metal fill 145. By way of example and not limitation, vias 135 in interconnect layer 105 can have a smaller width compared to interconnect vias 135 in interconnect layer 110. In some embodiments, bottom interconnect layer 105 can be referred to as "bottom electrode via layer" because it connects bottom electrodes 125 of MTJ structures 100 with lower interconnect layers below interconnect layer 105, which are not shown in FIG. 1.

In some embodiments, barrier layer 140 can be a stack of two or more layers and metal fill 145 can be an electroplated metal. For example, barrier layer 140 can include a bottom TaN layer and a top Ta layer deposited by PVD, and metal fill 145 can be electroplated Cu or a Cu-alloy (e.g., copper manganese (CuMn)).

In some embodiments, ILD 150 can be a low-k dielectric material with a k-value below 3.9 (e.g., 3.6), silicon nitride, silicon oxide, silicon oxynitride, FSG, or UDOX. In some embodiments, ILD 150 can be a stack of dielectrics such as a low-k dielectric and another dielectric. The stack of dielectrics can be, for example, (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. ILD 150 can be deposited by an APCVD process, a HDPCVD process, or a PECVD process.

ILD 155 can be a low-k dielectric material with a k-value below 3.9 or a stack of dielectrics such as a low-k dielectric and another dielectric. The stack of dielectrics can be, for example, (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. ILD 155 can be deposited by a HDPCVD process or a PECVD process.

In some embodiments, bottom interconnect layer 105 can be formed before MTJ structures 100, and top interconnect layer 110 can be formed after the formation of MTJ structures 100. In some embodiments, additional MTJ structures 100 can be formed between interconnect layers 105 and 110. Top and bottom interconnect layers (e.g., 110 and 105 respectively)—along with the one or more MTJ structures, like MTJ structure 100—can be part of an integrated circuit (IC) structure. The IC structure can include additional layers, not shown in FIG. 1. For example, additional BEOL layers, middle of the line (MOL) layers, and front-end of the line (FEOL) layers can be formed below interconnect layer 105. By way of example and not limitation, an FEOL layer can include transistors and capacitor structures. An MOL layer can include a network of contacts that connect the transistors and the capacitor structures in the FEOL to the structures in the BEOL layers.

In some embodiments, interconnect layers 105 and 110 can include additional layers, such as etch stop layers 160 and 165, and capping layers 170 and 175. By way of example and not limitation, etch stop layer 160 can be silicon-carbon nitride (SiCN) or aluminum oxide (AlN) with a thickness range between about 10 Å and about 150 Å; etch stop layer 165 can be a SiCN layer with a thickness range between about 100 Å and about 300 Å; capping layer 170 can be aluminum oxide ($Al_2O_3$) with a thickness between about 10 Å to about 40 Å; and capping layer 175 can be silicon oxide with a thickness between about 100 Å and about 300 Å.

As shown in FIG. 1, vias 135 of interconnect layer 105 can be in contact with bottom electrodes 125 of MTJ structures 100. As a result, Cu atoms from vias 135 of interconnect layer 105 can out-diffuse towards bottom electrodes 125 of MTJ structures 100. By way of example and not limitation, Cu diffusion can occur due to thermal processing of subsequent layers ("thermal diffusion") or due to the application of an electric field across vias 135 during normal operation. As discussed above, diffusion of Cu atoms into MTJ structures 100 (Cu "poisoning") can disrupt the MRAM's normal operation and cause reading errors. For example, diffused Cu atoms can cause leakage across MTJ stack 115 and prevent MTJ structures 100 from storing charge.

Figure 2:
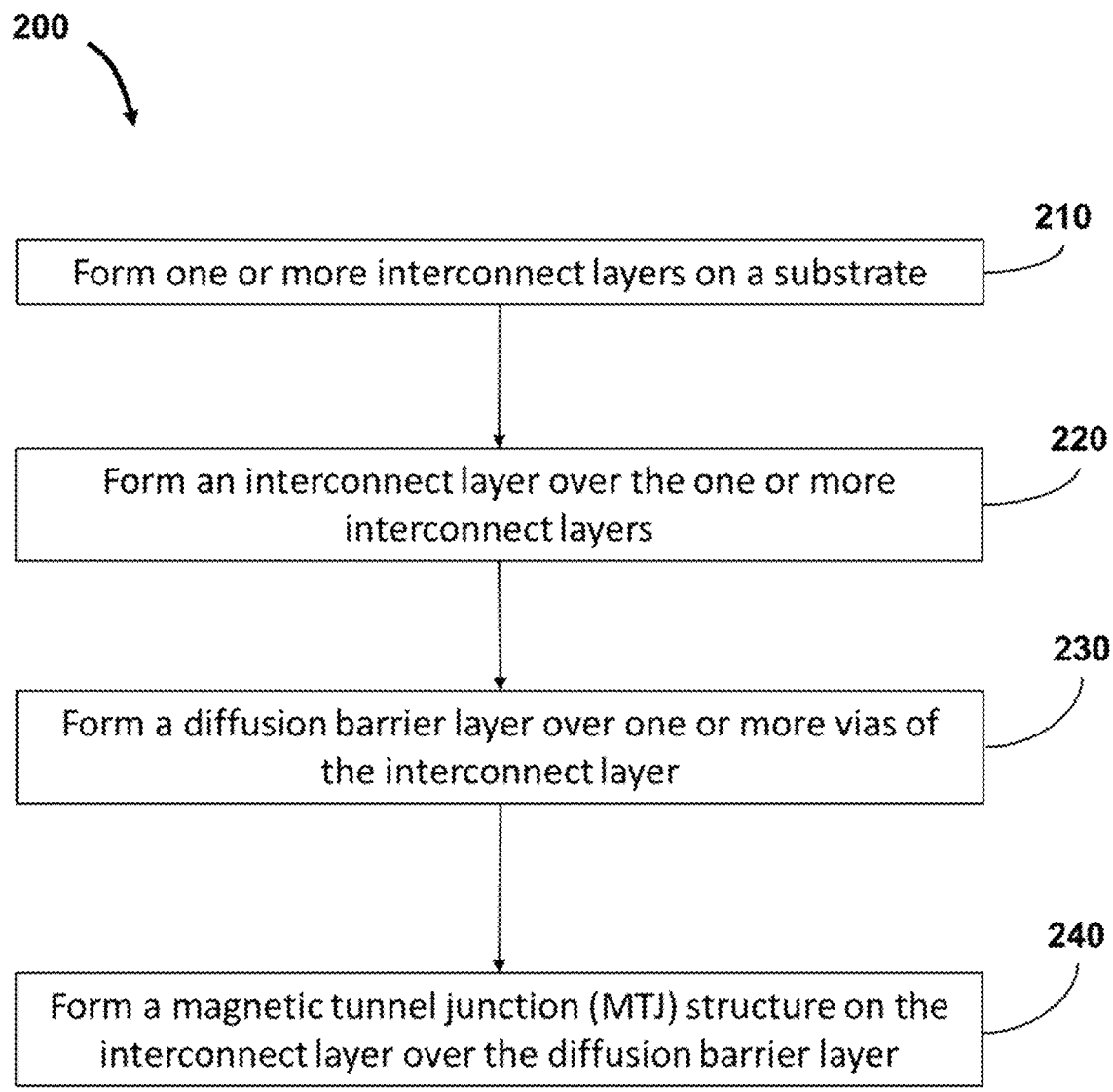
FIG. 2 is a flowchart of a fabrication method for forming a capping layer between an interconnect layer and the bottom electrodes of magnetic tunnel junction structures, according to some embodiments.

FIG. 2 is a flowchart of an exemplary fabrication method 200 for forming a diffusion barrier layer on vias 135 of interconnect layer 105 prior to the formation of MTJ structures 100. In some embodiments, the diffusion barrier layer can include Co or another metal, such as Ru. The diffusion barrier layer can be selectively formed over Cu interconnects (e.g., vias 135 of interconnect layer 105) that contact bottom electrodes 125 of respective MTJ structures 100. According to some embodiments, the diffusion barrier layer can prevent Cu out-diffusion from vias 135 of interconnect layer 105 to the corresponding MTJ structures 100. Fabrication method 200 may not be limited to the operations described below. Other fabrication operations may be performed between the various operations of fabrication method 200 and are omitted merely for clarity.

In referring to FIG. 2, exemplary fabrication method 200 begins with operation 210 where one or more interconnects can be formed on a substrate. In some embodiments, the substrate with the one or more interconnect layers can be a partially fabricated wafer in BEOL. Therefore, additional layers can be formed between the substrate and the one or more interconnect layers, such as MOL and FEOL layers. By way of example and not limitation, an FEOL layer can include transistors and capacitor structures, and an MOL layer can provide the electrical connections between the transistors and the capacitor structures in the FEOL layer and the one or more interconnect layers in the BEOL.

Figure 3:
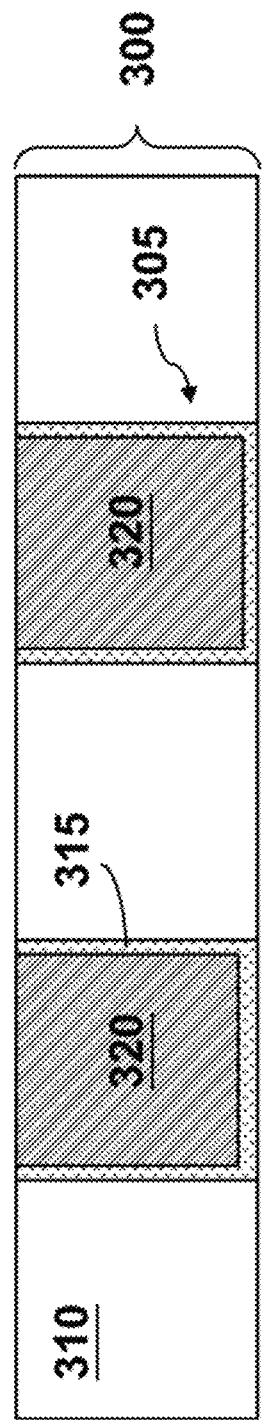
FIG. 3 is a cross-sectional view of an interconnect layer, according to some embodiments.

According to some embodiments, FIG. 3 is a cross-sectional view of an exemplary BEOL interconnect layer 300. Interconnect layer 300 can be, for example, a top interconnect layer from one or more BEOL interconnect layers over a substrate. In the example of FIG. 3, the underlying BEOL interconnect layers, MOL layers, FEOL layers, and the substrate are not shown merely for clarity. In other words, BEOL interconnect layer 300 can be a top layer of a partially fabricated wafer, according to some embodiments. Further, FIG. 3 depicts only a portion of interconnect layer 300.

Interconnect layer 300 can include one or more vias 305 and one or more lines (not shown in FIG. 3 for clarity). Vias 305 and lines (not shown) are embedded in ILD 310 and can be filled with a metal stack that includes at least a barrier layer 315 and a metal fill 320. In some embodiments, barrier layer 315 can be a stack of two or more layers. Metal fill 320 can be a metal or a metal alloy that can be electroplated. By way of example and not limitation, barrier layer 315 can be a TaN/Ta stack deposited by PVD, and metal fill 320 can be electroplated Cu or a Cu-alloy (e.g., CuMn).

ILD 310 can be a low-k dielectric material or a polymer with a k-value below 3.9 (e.g., 3.6) or a stack of dielectrics such as a low-k dielectric and another dielectric. By way of example and not limitation, the polymer can be a long carbon chain, a porous polymer, an amorphous polymer, etc. The stack of dielectrics can include, for example, (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. ILD 310 can be deposited by a HDPCVD process or a PECVD process.

In some embodiments, one or more of interconnect layers 105 and 110 of FIG. 1 are formed in a similar manner as interconnect layer 300.

Figure 4:
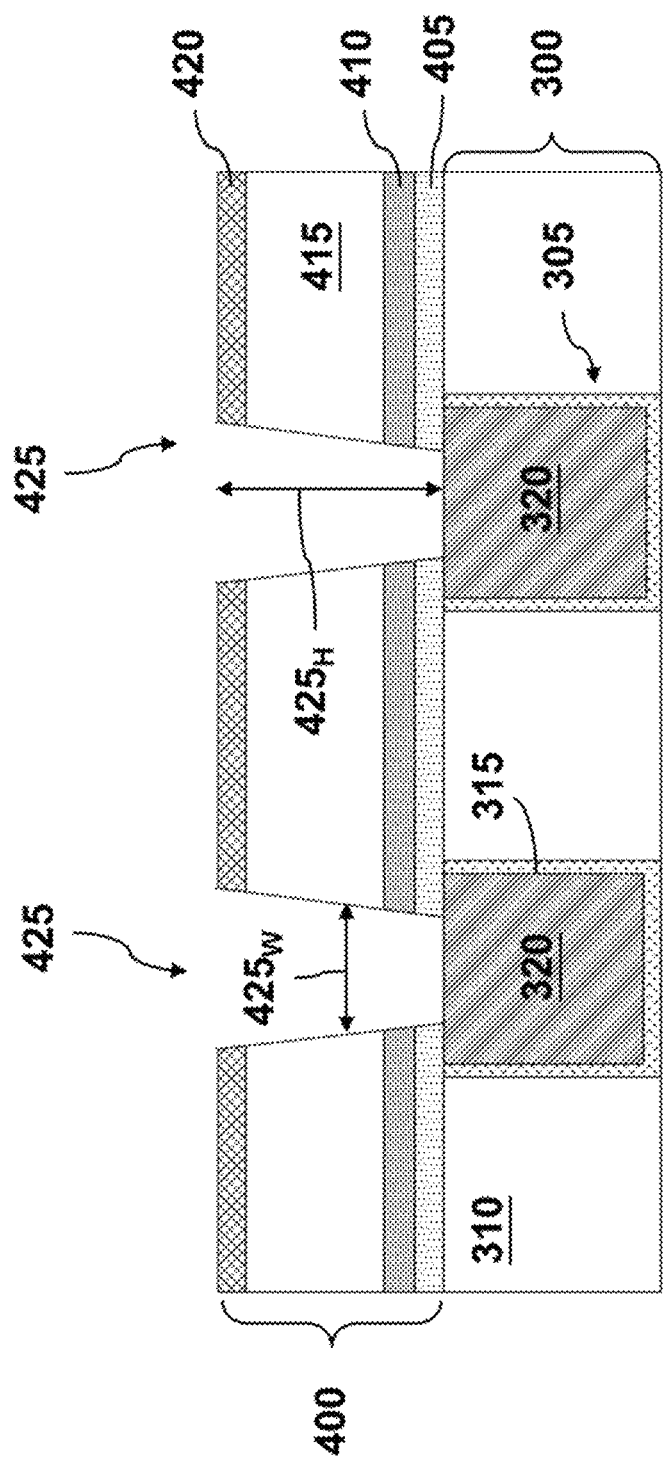
FIG. 4 is a cross-sectional view of an interconnect layer after the formation of via openings, according to some embodiments.

Referring to FIG. 2, fabrication method 200 continues with operation 220 and the formation of another interconnect layer over interconnect layer 300. For example, as shown in FIG. 4, interconnect layer 400 can be formed over interconnect layer 300. Interconnect layer 400 can include both vias and lines. Further, the vias of interconnect layer 400 (after a metal fill) can contact vias 305 of interconnect layer 300. For example purposes, interconnect layer 400 will be described in the context of via interconnects. Interconnect layer 400 can also include line interconnects, which are within the spirit and scope of this disclosure.

By way of example and not limitation, fabrication of interconnect layer 400 can be described as follows: etch stop layers 405 and 410 can be blanket deposited over interconnect layer 300. Etch stop layer 405 can be SiCN or AlN with a thickness between about 10 Å and about 150 Å, and capping layer 410 can be aluminum oxide (AlO) with a thickness between about 10 Å and about 40 Å. ILD 415 can be subsequently formed over etch stop layer 410. In some embodiments, ILD 415 can be a low-k dielectric material with a k-value below 3.9, silicon nitride, silicon oxide, silicon oxynitride, FSG, or UDOX. In some embodiments, ILD 415 can be a stack of dielectrics such as a low-k dielectric and another dielectric. The stack of dielectrics can include, for example, (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. ILD 415 can be deposited by an APCVD process, a HDPCVD process, or a PECVD process. Subsequently, an antireflective coating (ARC) 420 can formed over ILD 415. Anti-reflective coating 420 can suppress ultra violet (UV) or extreme ultra violet (EUV) light reflections during a subsequent photolithography step and minimize undesirable generation of standing waves. Standing waves can increase the edge roughness of the resulting patterned structures. Antireflective coating 420 also forms a flat surface, on which a photoresist layer (not shown in FIG. 4) can be formed during a photolithography step, by operating as a "filler" that fills small imperfections on the top surface of ILD 415. In some embodiments, antireflective coating 420 can be a nitrogen-free antireflective coating (NFARC).

One or more via openings 425 can be formed in ILD 415 by a photolithography process. The photolithography process can include, for example, the deposition and patterning of a photoresist layer (not shown in FIG. 4) over antireflective coating 420, followed by an etch process that forms via openings 425 in ILD 415 in predetermined locations as shown in FIG. 4. In some embodiments, the formation of via openings 425 can be performed in two or more etch operations which can include different etch chemistries. The surfaces of via openings 425 can be subjected to a wet clean to remove byproducts of the etch process. In some embodiments, the aspect ratio (e.g., the ratio of height $425_H$ to width $425_W$) for via opening 425 is between about 2:1 and about 6:1 (e.g., about 3:1). However, the aforementioned aspect ratio range is not limiting and more aggressive aspect ratios (e.g., about 7:1, about 8:1, about 10:1, etc.) can be used.

Figure 5:
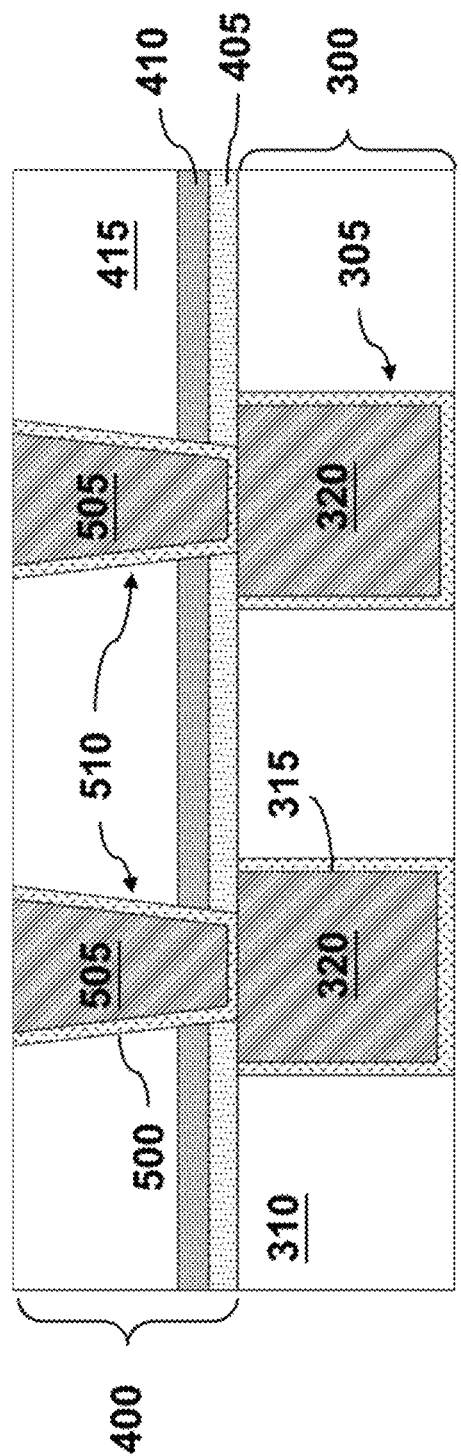
FIG. 5 is a cross-sectional view of an interconnect layer after the formation of a chemical mechanical planarization (CMP) operation, according to some embodiments.

In FIG. 5, a barrier layer 500 can be blanket-deposited in via openings 425 to cover the exposed surfaces of via openings 425. Further, barrier layer 500 can also cover the top surface of antireflective coating 420. In some embodiments, barrier layer 500 can be a single layer or a stack of two or more layers. For example, barrier layer 500 can be a Co layer deposited by ALD or a TaN/Ta stack (e.g., TaN being the bottom layer and Ta being the top layer of the stack) deposited by PVD. Via openings 425 can be subsequently filled with metal fill 505. Metal fill 505 is deposited over barrier layer 500 in via openings 425 and over antireflective coating 420. In some embodiments, metal fill 505 can be Cu or a Cu alloy (e.g., CuMn). By way of example and not limitation, metal fill 505 can be electroplated so that it fills via opening 425 without forming voids. A subsequent chemical mechanical planarization (CMP) process can be used to remove metal fill 505, barrier layer 500, and antireflective coating 420 over ILD 415 so that the top surfaces of ILD 415, metal fill 505 and barrier layer 500 are substantially coplanar. The CMP process concludes the formation of vias 510. Lines in interconnect layer 400 (not shown) can be formed concurrently with vias 510. By way of example and not limitation, the size of vias 510 can be smaller, larger, or equal to the size of vias 305 in interconnect layer 300.

Figure 6:
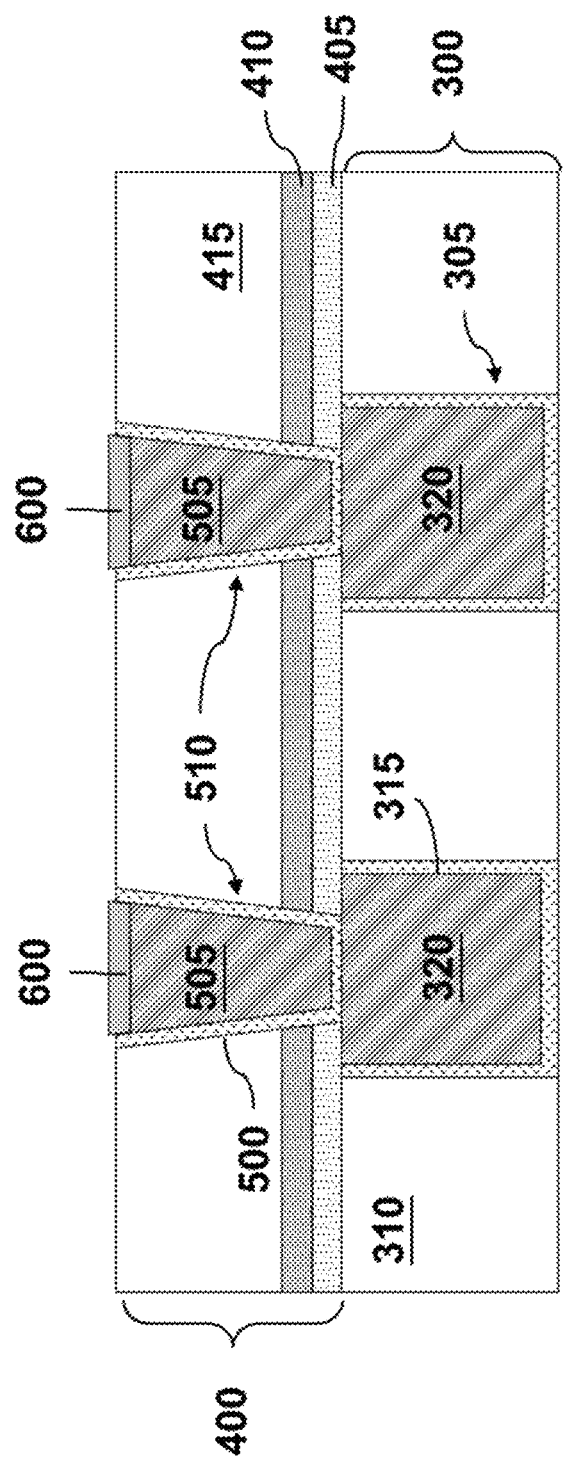
FIG. 6 is a cross-sectional view of two interconnect layers with the top interconnect layer having a diffusion barrier layer (capping layer) selectively formed over its vias, according to some embodiments.

Referring to FIG. 2, fabrication method 200 continues with operation 230 and the formation of a diffusion barrier layer on the one or more vias 510 of interconnect layer 400. In some embodiments, the diffusion barrier of operation 230 is formed on a top surface of metal fill 505. According to some embodiments, the formation of the diffusion barrier layer prevents the out-diffusion of Cu from metal fill 505. For example, referring to FIG. 6, a diffusion barrier layer (or capping layer) 600 can be selectively formed on a top surface of metal fill 505 of vias 510. In some embodiments, diffusion barrier layer or capping layer 600 can have a thickness that ranges from about 10 Å to about 100 Å. According to some embodiments, a thinner diffusion barrier layer 600 (e.g., with a thickness less than about 10 Å) may not prevent the out-diffusion of metal fill 505, while a thicker diffusion barrier layer 600 (e.g., with a thickness greater than about 100 Å) may unnecessarily increase the deposition time of the diffusion barrier layer, which can in turn impact the deposition process throughput. Diffusion barrier layer 600 can include a metal, such as Co or Ru. In some embodiments, the diffusion barrier layer 600 is a polycrystalline material that does not chemically interact with metal fill 505 to form a compound. Additionally, diffusion barrier layer 600 can be deposited by a variety of deposition techniques including: physical vapor deposition (PVD), CVD, plasma-enhanced CVD (PECVD), atomic layer deposition (ALD), or plasma-enhanced ALD (PEALD). Diffusion barrier layer 600 can be deposited at a temperature between about 100° C. and about 500° C., according to some embodiments. The process pressure, during deposition, can range from about 0.1 Torr to about 100 Torr depending on the reactor geometry and the deposition technique.

For example purposes, diffusion barrier layer or capping layer 600 will be described in the context of Co metal deposited with a PEALD process. Based on the disclosure herein, additional materials (e.g., Ru) and/or other deposition methods can be used. These additional materials and other deposition methods are within the spirit and scope of this disclosure.

In some embodiments, an organometallic precursor—for example, cyclopentadienylcobalt dicarbonyl (($C_5H_5$)Co$(CO)_2$)—can be used to selectively deposit Co on metal fill 505. Other Co organometallic precursors, such as cobalt(II) sulfate ($CoSO_4$), cobalt(II) nitrate ($Co(NO_3)_2$), or sodium cobaltinitrite can be used and are within the spirit and the scope of the present disclosure. The selective formation of Co diffusion barrier layer 600 is described below. The top surface of metal fill 505 is pre-treated with one or more gases that include, but are not limited to, argon (Ar), hydrogen ($H_2$), ammonia ($NH_3$) or any combination thereof. The aforementioned gas or gases can chemically reduce (e.g., remove) a native oxide that is formed on the top surface of metal fill 505. The thickness of the native oxide is less than about 100 Å. Oxidation of Cu (or CuMn) vias can occur, for example, during vacuum breaks between processing operations and can undesirably increase via/line resistance. The time period for the pre-treatment can be from about 10 s to about 30 s and can be performed at a temperature between about 100° C. and about 500° C., according to some embodiments.

Without a vacuum break, interconnect layer 400 is exposed to the Co precursor at a temperature between about 100° C. and about 500° C. In some embodiments, the formation of the diffusion barrier layer is a two-step process. During the first step, the Co precursor is partially thermally-decomposed over the exposed surfaces of interconnect layer 400. In some embodiments, the partially decomposed Co precursor can be physisorbed (e.g., weakly bonded via electrostatic forces) on ILD 415 and chemisorbed (e.g., strongly bonded via chemical bonding) on the exposed surface of interconnect layer 400. During a subsequent evacuation cycle, the physisorbed, and partially decomposed, Co precursor can be removed from ILD 415. As a result, one or more monolayers of partially decomposed precursor can be favorably formed over exposed surfaces of metal fill 505.

During the second step, a plasma can be used to fully decompose the one or more monolayers of the partially decomposed precursor to form Co diffusion barrier layer 600 on metal fill 505. In some embodiments, volatile byproducts from the precursor's decomposition are concurrently removed from the reactor via evacuation (e.g., by pumping-down the reactor). By way of example and not limitation, in the case of a cyclopentadienylcobalt dicarbonyl precursor, the chemical reactions can be described by the two following steps:

$$(C_5H_5)Co(CO)_2 + \text{thermal energy} \rightarrow \text{Co-ligand} + \text{volatile byproducts} \quad (1)$$

$$\text{Co-ligand} + \text{plasma} \rightarrow \text{Co diffusion barrier formation} + \text{volatile byproducts} \quad (2)$$

In some embodiments, the precursor exposure, evacuation cycles, and plasma exposures can be repeated until a desired thickness of Co is formed (e.g., between about 10 Å to about 100 Å). According to some embodiments, the plasma can be a mixture of one or more of the following gases: Ar, H$_2$, ozone (O$_3$), nitrogen (N$_2$), and/or NH$_3$. According to some embodiments, the plasma treatment can be performed at a temperature between about 100° C. and about 500° C.

In some embodiments, and as a result of the aforementioned deposition process, diffusion barrier layer 600 does not form over ILD 415.

Figure 7:
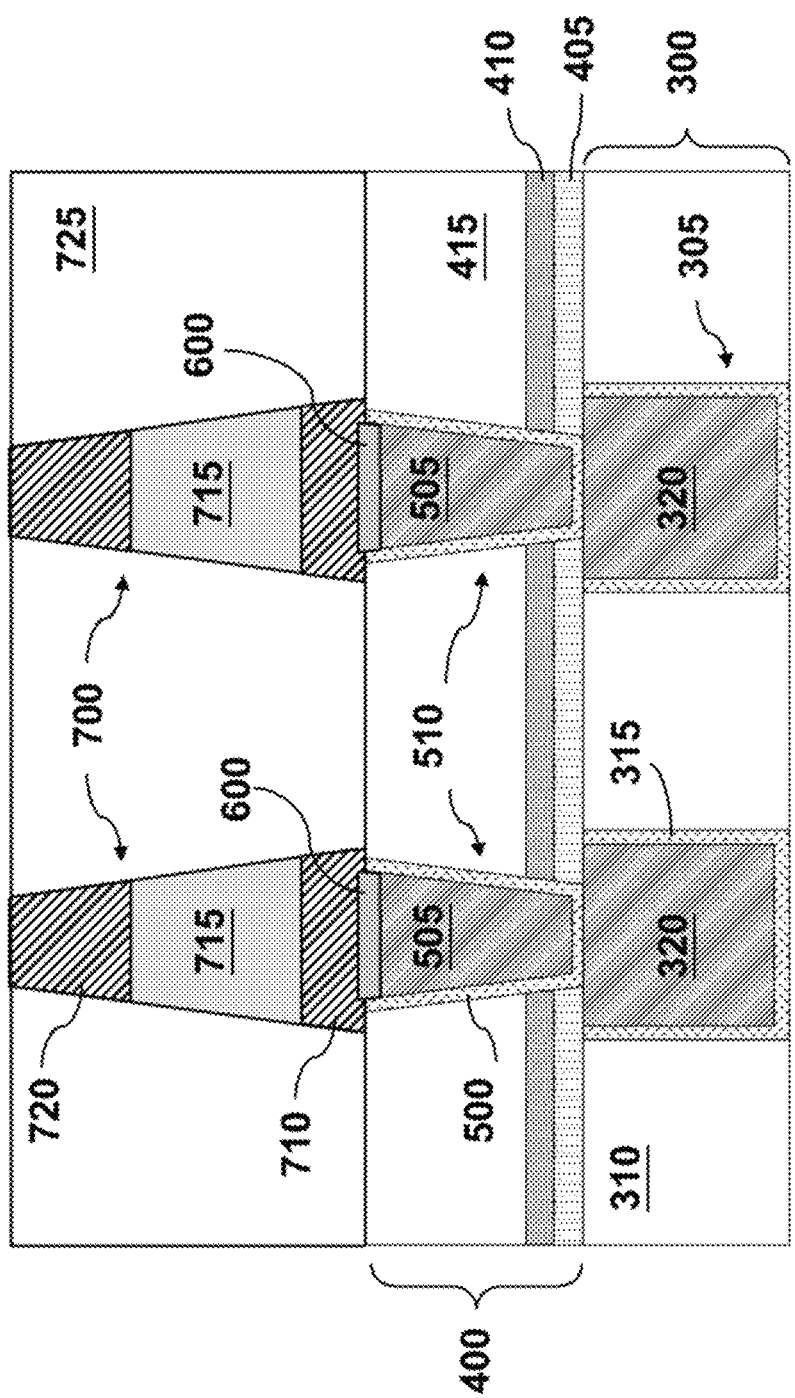
FIG. 7 is a cross-sectional view of magnetic tunnel junction (MTJ) structures over an interconnect layer with a capping layer formed between the bottom electrode of the MTJ structures and the vias of the interconnect layer, according to some embodiments.

Referring to FIG. 2, fabrication method 200 continues with operation 240 and the formation of an MTJ structure over each of the Co diffusion barrier layers 600. For example, as shown in FIG. 7, MTJ structures 700 can be formed in ILD 725 and over selected vias 510 of interconnect layer 400. As discussed earlier, Co diffusion barrier layer 600 can prevent or reduce Cu out-diffusion from metal fill 505 to MTJ structures 700 by blocking mobile Cu atoms from reaching bottom electrode 710 and MTJ stack 715. In some embodiments, interconnect layer 400 may have additional vias (e.g., like vias 510) that may not be connected to MTJ structures 700. These vias, which are not connected to MTJ structures 700, may not have a diffusion barrier layer 600 formed thereon.

In some embodiments, additional interconnect layers can be formed over top electrode 720 and ILD 725, as discussed above in FIG. 1. For example, an interconnect layer, like interconnect layer 110 shown in FIG. 1, can be formed over MTJ structures 700 so that top electrodes 720 of MTJ structures 700 are in contact with respective vias of the interconnect layer.

Figure 8:
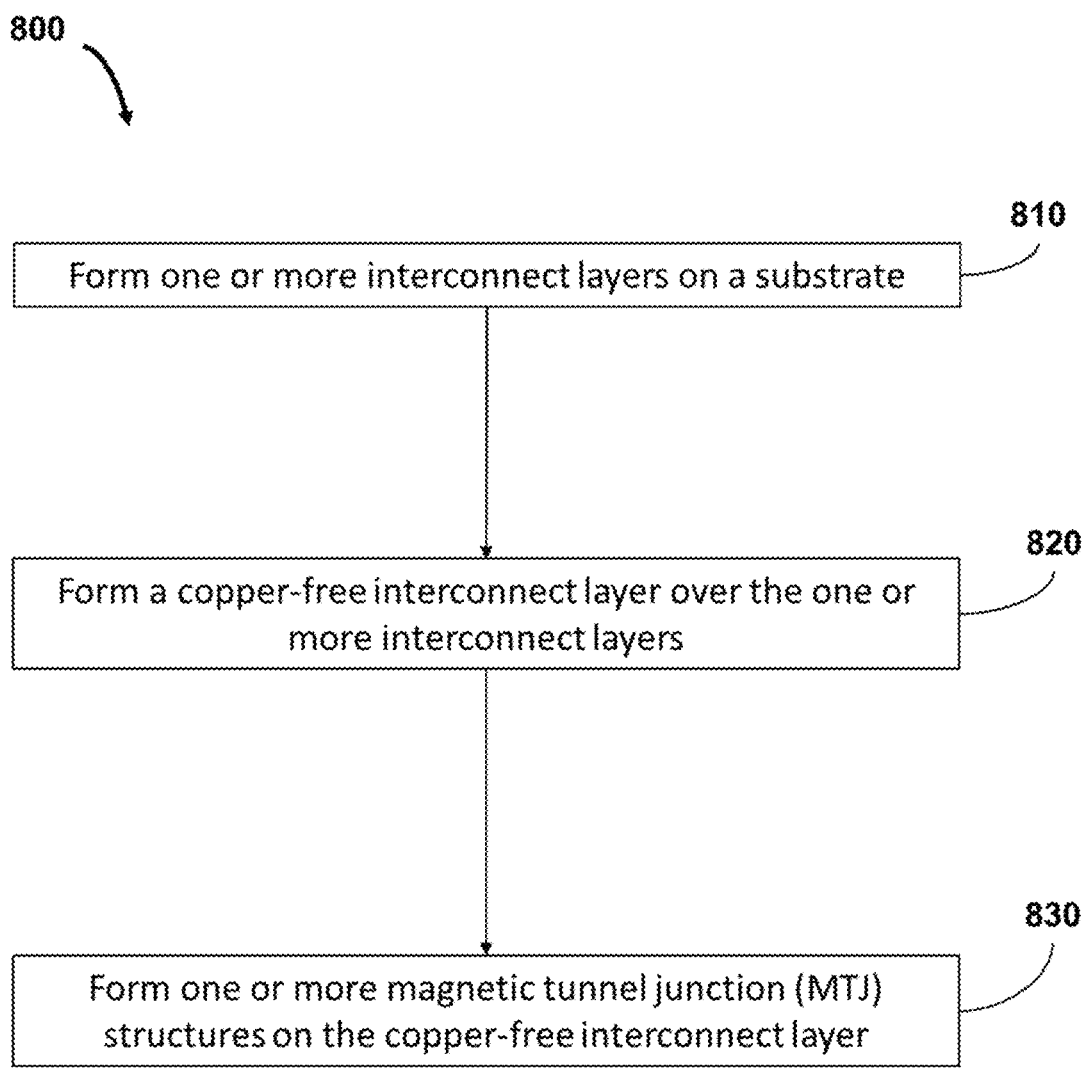
FIG. 8 is a flowchart of a fabrication method for forming a copper-free interconnect layer below magnetic tunnel junction structures, according to some embodiments.

FIG. 8 is a flowchart of an exemplary fabrication method 800 for forming a copper-free (Cu-free) interconnect layer on which MTJ structures can be formed. Since the interconnect layer is Cu-free (e.g., contains no Cu-based material), there are no Cu atoms available to diffuse to the MTJ structures. Fabrication method 800 may not be limited to the operations described below and other fabrication operations may be performed between the various operations of fabrication method 800 and are omitted merely for clarity.

In referring to FIG. 8, exemplary fabrication method 800 begins with operation 810 where one or more interconnect or contact layers are formed on a substrate. In some embodiments, the substrate with the one or more interconnect layers can be a partially fabricated wafer in BEOL, where the formed interconnect layers include—for example—Cu-based conductive structures (e.g., vias and lines). Additional layers can be formed between the substrate and the one or more interconnect layers, such as MOL and FEOL layers. An FEOL layer can include, for example, transistors, resistors, and capacitor structures, and an MOL layer can provide the electrical connections (e.g., contact structures) between the transistors in the FEOL layer and the one or more interconnect layers in the BEOL.

FIG. 3 is a cross-sectional view of an exemplary BEOL interconnect layer 300 which can serve as a starting point for fabrication method 800, according to some embodiments. As discussed above, interconnect layer 300 can be, for example, a top interconnect layer from one or more BEOL interconnect layers over a substrate. In some embodiments, interconnect layer 300 is a Cu metallization layer. That is, metal fill 320 in vias 305 can include electroplated Cu or a Cu-alloy (e.g., CuMn). Interconnect layer 300 can also include lateral conductive structures (e.g., lines), which are not shown in FIG. 3 for simplicity. In the example of FIG. 3, the underlying BEOL interconnect layers, MOL layers, FEOL layers, and the substrate are not shown merely for clarity. In other words, BEOL interconnect layer 300 can be a top layer of a partially fabricated wafer, according to some embodiments.

In referring to FIG. 8, fabrication method 800 continues with operation 820 and the formation of a Cu-free interconnect layer over interconnect layer 300. The fabrication process of the Cu-free interconnect can be described using FIG. 4. By way of example and not limitation, etch stop layers 405 and 410 can be blanket deposited over interconnect layer 300. Etch stop layer 405 can be SiCN or MN with a thickness between about 10 Å and about 150 Å, and capping layer 410 can be Al$_2$O$_3$ with a thickness between about 10 Å and about 40 Å. ILD 415 can be subsequently formed over etch stop layer 410. In some embodiments, ILD 415 can be a low-k dielectric material with a k-value below 3.9, silicon nitride, silicon oxide, silicon oxynitride, FSG, or UDOX. In some embodiments, ILD 415 can be a stack of dielectrics such as a low-k dielectric and another dielectric. The stack of dielectrics can include, for example, (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. ILD 415 can be deposited by an APCVD process, a HDPCVD process, or a PECVD process. Subsequently, an ARC 420 can be formed over ILD 415.

One or more via openings 425 can be formed in ILD 415 by a photolithography process. The photolithography process can include, for example, the deposition and patterning of a photoresist layer (not shown in FIG. 4) over antireflective coating 420, followed by an etch process that forms via openings 425 in ILD 415 in predetermined locations as shown in FIG. 4. In some embodiments, the formation of via openings 425 can be performed in two or more etch operations which can include different etch chemistries. The surfaces of via openings 425 can be subjected to a wet clean to remove byproducts of the etch process. As discussed above, the aspect ratio of via opening 425 is between about 2:1 and about 6:1 (e.g., about 3:1). However, this is not limiting and via openings with more aggressive aspect ratios (e.g., about 7:1, about 8:1, about 9:1, about 10:1. etc.) can be formed as long as the Cu-free process can fill the via openings without voids.

According to some embodiments, a pre-clean process can be used to remove the native CuO layer from vias 305 at the bottom each via openings 425. The pre-clean process can include one or more sequential operations. By way of example and not limitation, the pre-clean process can include a dry etch process with a hydrogen (H$_2$)/ammonia (NH$_3$)/nitrogen trifluoride (NF$_3$) plasma followed by a dry etch process with a nitrogen (N$_2$)/hydrogen (H$_2$) plasma. During the pre-clean process direct current (DC) and radio frequency (RF) power signals can be applied to the plasma. In some embodiments, the DC power can range from about 100 Watts to about 2000 Watts, and the RF power can range from about 50 Watts to about 500 Watts.

Subsequently, a Cu-free metallization process can be used to fill via openings 425. For example, in FIG. 9, a barrier layer 900 and Cu-free metal fill 910 can be used. In some embodiments, barrier layer 900 is a stack that includes a bottom layer of titanium (Ti) and a top layer of titanium nitride (TiN). The thickness of barrier layer 900 can range from about 10 Å to about 100 Å. In some embodiments, the TiN top layer of barrier layer 900 is doped with elements including fluorine (F), oxygen (O), nitrogen (N), chlorine (Cl), silicon (Si) carbon (C), arsenic (As), germanium (Ge), or cobalt (Co). In some embodiments, the TiN thickness can be adjusted so that the resistivity of the top TiN layer of barrier layer 900 is between about 10 $\mu\Omega$-cm to about 200 $\mu\Omega$-cm.

Figure 9:
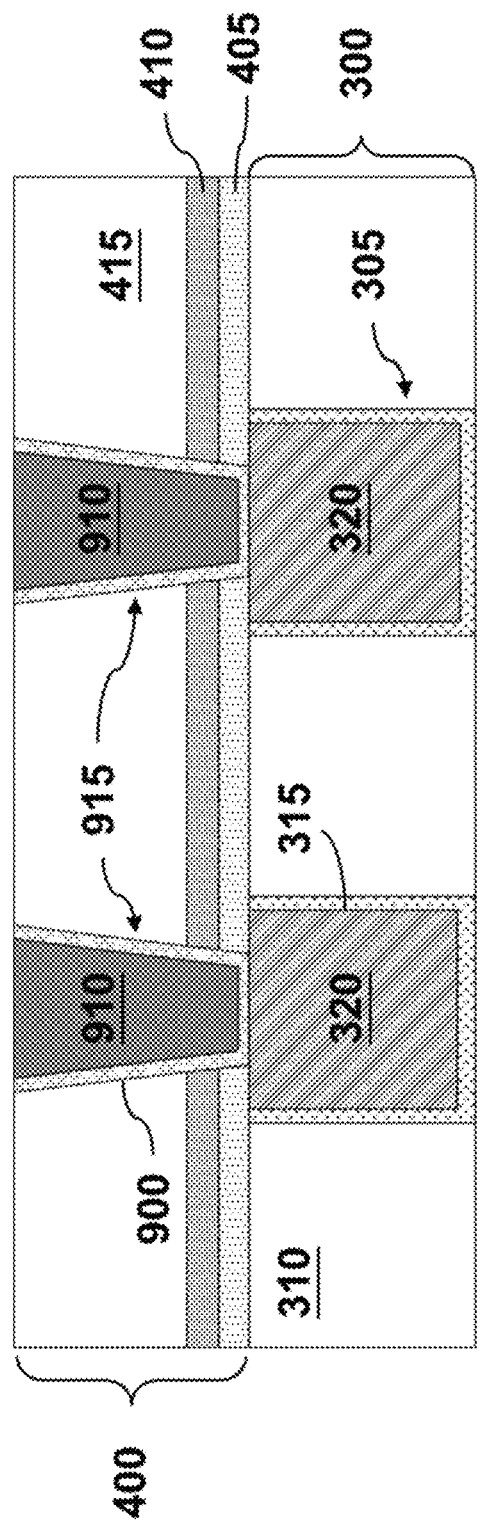
FIG. 9 is a cross-sectional view of an interconnect layer after the formation of copper-free metal vias, according to some embodiments.

According to some embodiments, Ti can be blanket-deposited by PVD-based method (e.g., sputtering), and TiN can be deposited by an ALD or a PEALD process. In some embodiments, barrier layer 900 is deposited over antireflective coating 420 (shown in FIG. 4). By way of example and not limitation, Cu-free metal fill 910 can include W which may be blanket-deposited by CVD, ALD, or a combination thereof. For example, the W deposition can include an ALD-deposited W nucleation layer with a thickness between about 5 Å and about 100 Å, followed by a CVD-deposited W fill with a thickness between about 200 nm to about 500 nm. By way of example and not limitation, the precursor for W can be organometallic (e.g., tungsten carbonyl) or halide-based (e.g., $WF_6$) with silane and/or hydrogen as the co-reactants. After the deposition of Cu-free metal fill 910, a CMP process can be used to remove metal fill 910, barrier layer 900 and antireflective coating 420 over ILD 415 so that the top surfaces of metal fill 910, barrier layer 900, and ILD 415 are coplanar, as shown in FIG. 9. After the CMP process, the formation of Cu-free vias 915 is complete.

Figure 10:
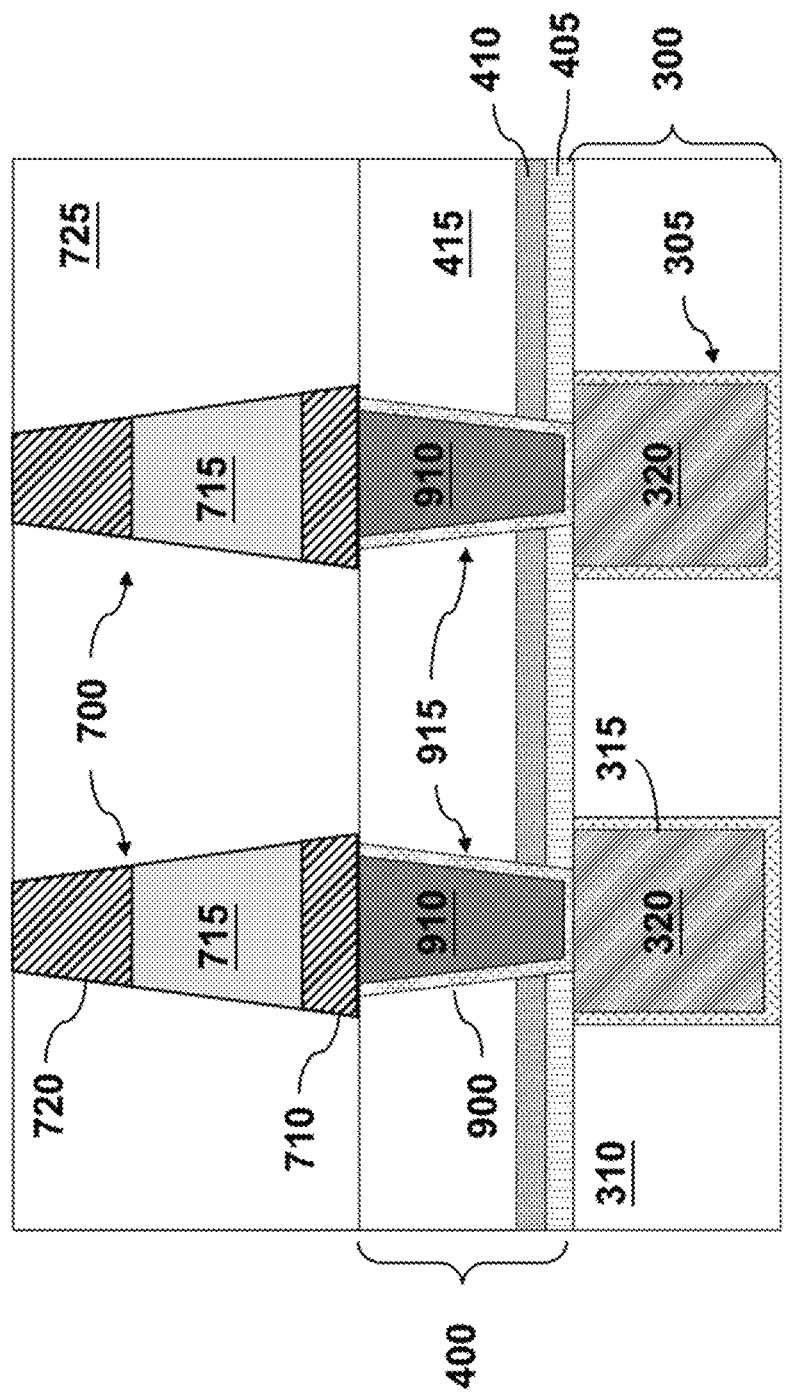
FIG. 10 is a cross-sectional view of magnetic tunnel junction (MTJ) structures formed over a copper-free interconnect layer, according to some embodiments.

In operation 830 of fabrication method 800 shown in FIG. 8, one or more MTJ structures 700 can be formed directly on Cu-free interconnect layer 400 of FIG. 9, as shown in FIG. 10. As discussed above, since interconnect layer 400 of FIG. 9 does not use Cu-based materials to form vias 915, there are no Cu atoms available to diffuse to MTJ structures 700 through bottom electrodes 710.

In some embodiments, MTJ structures 700 are limited to certain areas of the substrate, in which these certain areas do not include MTJ structures 700. For example, ILD 725 can include, adjacent to MTJ structures 700, additional conductive structures (e.g., vias and lines) where MTJ structures 700 are not present. These additional conductive structures are not shown in FIG. 7. In some embodiments, Cu-free vias 915 can be formed below MTJ structures 700 and Cu-based vias in interconnect layer 400 can be formed below other conductive structures of ILD 725. Therefore, interconnect layer 400 can also include Cu-based vias in these certain areas of the substrate, where MTJ structures 700 are not present.

In some embodiments, additional interconnect layers can be formed over top electrode 720 and ILD 725, as discussed above in FIG. 1. For example, an interconnect layer, like interconnect layer 110 shown in FIG. 1, can be formed over MTJ structures 700 so that top electrodes 720 of MTJ structures 700 are in contact with respective vias of the interconnect layer. In some embodiments, the conductive structures (e.g., lines and vias) of the interconnect layer formed over MTJ structures 700, can be filled with a Cu-based conductive material or a conductive material that is different from Cu-free metal fill 910.

The present disclosure is directed to exemplary interconnect fabrication methods that can prevent or reduce out-diffusion of Cu from interconnect layers to MTJ structures. According to some embodiments, a Co or Ru diffusion barrier layer can be formed between the Cu interconnects and the MTJ structures to prevent diffusion of Cu between the vias in the interconnect layer and the MTJ structure. The Co or Ru diffusion barrier layer can be selectively formed over the Cu interconnects. In another embodiment, a Cu-free interconnect layer can be formed using a W metallization scheme in place of Cu. W atoms, unlike Cu atoms, are not mobile and therefore do not out-diffuse to neighboring structures.

In some embodiments, a method includes forming an interconnect layer over a substrate, where forming the interconnect layer includes forming an interlayer dielectric stack with openings therein; disposing a metal in the openings to form corresponding conductive structures; and selectively depositing a diffusion barrier layer on the metal. In the method, selectively depositing the diffusion barrier layer includes pre-treating the surface of the metal; disposing a precursor to selectively form a partially-decomposed precursor layer on the metal, and exposing the partially-decomposed precursor layer to a plasma to form the diffusion barrier layer. The method further includes forming an MTJ structure on the interconnect layer over the diffusion barrier layer, where the bottom electrode of the MTJ structure is aligned to the diffusion barrier layer.

In some embodiments, a structure includes an interconnect layer disposed over a substrate, where the interconnect layer comprises a conductive structure filled with a conductive material; a diffusion barrier layer that prevents out-diffusion of the conductive material and is disposed on the conductive structure; and a MTJ structure disposed on the interconnect layer, where the diffusion barrier layer is interposed between the bottom electrode of the MTJ structure and the conductive structure In some embodiments, a structure includes a first interconnect layer disposed over a substrate, where the first interconnect layer includes one or more first conductive structures with a first conductive material; and a second interconnect layer that is disposed over the first interconnect layer, where the second interconnect layer includes one or more second conductive structures, in contact with the one or more first conductive structures, having a second conductive material. Further, the second conductive material is different from the first conductive material. The structure also includes one or more MTJ structures disposed on the second interconnect layer and in contact with the one or more second conductive structures, respectively, where the bottom electrodes of the one or more MTJ structures are in contact with the second conductive material of the one or more second conductive structures.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a dielectric layer with an opening;
depositing a barrier layer in the opening;
depositing a conductive layer on the barrier layer;
forming a capping layer without performing a vacuum break between depositing the conductive layer and forming the capping layer, wherein forming the capping layer comprises forming the capping layer with a first portion in the conductive layer and surrounded by the barrier layer and a second portion protruding above top surfaces of the barrier layer and the dielectric layer; and
forming an electrode on the top surfaces of the barrier layer and the dielectric layer and surrounding the second portion of the capping layer.

2. The method of claim 1, further comprising depositing an anti-reflective coating on the dielectric layer prior to forming the opening in the dielectric layer.

3. The method of claim 2, further comprising removing the anti-reflective coating prior to forming the capping layer.

4. The method of claim 1, wherein depositing the barrier layer comprises depositing a cobalt layer.

5. The method of claim 1, wherein forming the dielectric layer comprises:
depositing a nitride layer; and
depositing a low-k dielectric layer on the nitride layer.

6. The method of claim 1, wherein forming the capping layer comprises forming a cobalt layer or a ruthenium layer.

7. The method of claim 1, wherein forming the capping layer comprises:
depositing a metal precursor layer on the conductive layer; and
exposing the metal precursor layer to a plasma comprising argon, hydrogen, nitrogen, or ammonia.

8. The method of claim 1, wherein forming the capping layer comprises depositing a precursor layer on the conductive layer at a temperature between about 100° C. and about 500° C.

9. The method of claim 1, further comprising forming a magnetic tunnel junction (MTJ) stack on the electrode.

10. The method of claim 1, wherein depositing the conductive layer comprises depositing a copper layer or a copper-alloy layer to fill the opening.

11. A method, comprising:
forming a dielectric layer on a substrate;
forming an opening in the dielectric layer;
depositing, in the opening, a metal layer;
forming a doped metal nitride layer on the metal layer;
depositing a conductive layer on the doped metal nitride layer; and
forming a magnetic tunnel junction (MTJ) structure on the metal layer and the doped metal nitride layer.

12. The method of claim 11, further comprising depositing an anti-reflective coating on the dielectric layer prior to forming the opening.

13. The method of claim 12, further comprising removing the anti-reflective coating prior to forming the MTJ structure.

14. The method of claim 11, wherein depositing the conductive layer comprises depositing a copper-free metal.

15. The method of claim 11, wherein depositing the conductive layer comprises depositing a tungsten layer.

16. The method of claim 11, wherein forming the doped metal nitride layer comprises doping the metal nitride layer with fluorine, oxygen, nitrogen, chlorine, silicon, carbon, arsenic, germanium, or cobalt dopants.

17. A structure, comprising:
an interconnect layer, disposed on a substrate, comprising:
a dielectric layer disposed on the substrate,
a metal layer disposed in the dielectric layer,
a doped metal nitride layer disposed on the metal layer, and
a conductive layer disposed on the doped metal nitride layer; and
a magnetic tunnel junction (MTJ) structure disposed on the conductive layer.

18. The structure of claim 17, wherein the conductive layer comprises a copper-free metal.

19. The structure of claim 17, wherein the doped metal nitride layer comprises fluorine, oxygen, nitrogen, chlorine, silicon, carbon, arsenic, germanium, or cobalt dopants.

20. The structure of claim 17, wherein the MTJ structure is disposed on the metal layer and the doped metal nitride layer.

* * * * *